United States Patent [19]

Baldwin et al.

[11] Patent Number: 4,462,110

[45] Date of Patent: Jul. 24, 1984

[54] DIGITAL PHASE-LOCKED LOOP

[75] Inventors: David R. Baldwin; Nicholas S. Lemak, both of Phoenix, Ariz.

[73] Assignee: Honeywell Information Systems Inc., Phoenix, Ariz.

[21] Appl. No.: 251,845

[22] Filed: Apr. 7, 1981

[51] Int. Cl.³ ............................................. H03B 3/04
[52] U.S. Cl. ...................................... 377/43; 377/47; 377/78; 377/104; 331/1 A
[58] Field of Search .......... 235/92 FQ, 92 TF, 92 PS, 235/92 PB; 364/703; 331/1 A; 377/19, 20, 43, 47, 49, 78, 104

[56] References Cited

U.S. PATENT DOCUMENTS

| | | | |
|---|---|---|---|
| 3,781,695 | 12/1973 | Jackson | 328/155 |
| 3,878,473 | 4/1975 | Furtney | 331/1 A |
| 3,889,186 | 6/1975 | Larson | 324/83 D |
| 3,983,498 | 9/1976 | Malek | 328/155 |
| 4,166,249 | 8/1979 | Lynch | 328/155 |
| 4,190,807 | 2/1980 | Weber | 331/1 A |
| 4,222,013 | 9/1980 | Bowers | 331/1 A |
| 4,242,639 | 12/1980 | Boone | |
| 4,276,512 | 6/1981 | Wittke | 328/133 |
| 4,396,915 | 8/1983 | Farnsworth | 340/870.03 |

Primary Examiner—James D. Thomas
Assistant Examiner—Archie E. Williams, Jr.
Attorney, Agent, or Firm—A. A. Sapelli; W. W. Holloway, Jr.; L. J. Marhoefer

[57] ABSTRACT

A phase-locked loop is implemented using strictly digital techniques. The average frequency of the input signal is first sampled by counting the number of pulses from a clock source which occur during a predetermined number of occurrences of the input signal. Thereafter, the number of pulses counted is divided by the number of cycles of the input signal which occurred during the counting period to determine an average number of pulses per input signal cycle. The number of pulses which occur between successive cycles of the input signal are then counted and compared against the previously determined average. A count which differs from the average indicates a change in phase of the input signal, and after appropriate weighting, is used to update the average to a new average. An output signal is produced when the number of pulses counted during a cycle of the input signal equals the average number of pulses determined to occur between successive cycles of the input signal.

22 Claims, 13 Drawing Figures

SYSTEM CLOCK

ADDER 208 AND ERROR WEIGHTING 204

Fig. 10

DIGITAL PHASE-LOCKED LOOP

CROSS-REFERENCE TO RELATED APPLICATIONS

Application Ser. No. 251,805, filed Apr. 7, 1981, entitled Long Term Response Enhancement for Digital Phase-Locked Loop, by David R. Baldwin and Nicholas S. Lemak, assigned to assignee of the present invention, and Application Ser. No. 251,846, filed July 10, 1981, entitled Short Term Response Enhancement for Digital Phase-Locked Loop, by David R. Baldwin and Nicholas S. Lemak, assigned to assignee of the present invention.

BACKGROUND OF INVENTION

1. Field of Invention

This invention relates to electronic circuits using phase-locked loops, and more particularly to implementation of a phase-locked loop using strictly digital techniques.

2. Description of Prior Art

A phase-locked loop is a device which produces an output signal at a frequency identical to and in phase with a signal supplied as an input therto. As the input signal changes in frequency, the output signal will likewise change in frequency in such a manner to maintain a zero difference in phase between the input and output signals.

In the past, phase-locked loops have been implemented using analog techniques. A basic analog phase-locked loop consists of three fundamental parts: a Phase Detector, a Filter, and a Voltage-Controlled Oscillator.

The Phase Detector is a device which detects the difference in phase between two input signals, and produces an output signal proportional to the amount of said phase difference. In a phase-locked loop, the two inputs to the Phase Detector are the Input Signal to the phase-locked loop, and the Output Signal of the phase-locked loop from a Voltage-Controlled Oscillator. The Output Signal from the Phase Detector is an analog signal, the magnitude of which is representative of the amount of phase difference between the two input signals thereto, hereinafter referred to as an error signal.

A Filter serves to remove any high-frequency components from the error signal produced by the Phase Detector, and provides a slowly varying Output Signal which is representative of the average error in phase between the Output Signal and the Input Signal.

A Voltage-Controlled Oscillator is an oscillator whose frequency is controlled by an Input Voltage. In a phase-locked loop, the Input Voltage to the Voltage-Controlled Oscillator is the output of the Filter, and is an error signal representative of the difference in phase between the Input Signal and the Output Signal. Due to the feedback of the Output Signal to one input of the Phase Detector, the frequency of the Voltage-Controlled Oscillator is adjusted by the Input Voltage to produce agreement in phase between the Input Signal and the Output Signal.

While prior art implementations of phase-locked loops have employed varying amounts of digital techniques, analog techniques have always been present, to some extent; most notably in the filter section of the phase-locked loop.

The present invention is distinguishable from such prior art in that the implementation of the phase-locked loop is accomplished using entirely digital techniques.

SUMMARY OF INVENTION

The present invention is directed to the design of a phase-locked loop using entirely digital techniques, and utilizes a clock source operating at a frequency significantly greater than the expected frequency of the input signal. The number of clock pulses which occur over a given number of cycles of the input signal are counted to determine an average number of clock pulses which occur between single cycles on the input signal. Thereafter, a counter counts the number of clock pulses which actually do occur during a cycle of the input signal, and the count obtained is thereafter compared with the number of clock pulses expected to occur based on the measured average. From the comparison, an error signal is generated which indicates the number of clock pulses by which the input signal was displaced in time from the point at which it was expected. The error signal is then used to update the estimated number of clock pulses expected to occur between successive input signals, and the process is repeated.

A primary object of the present invention is to provide for the design of a phase-locked loop.

A further object of the present invention is to provide for the design of a phase-locked loop using entirely digital techniques.

The various novel features of this invention, along with the foregoing and other objects, as well as the invention itself both as to its organization and method of operation, may be more fully understood from the following description of a disclosed embodiment when read in conjunction with the accompanying drawings.

DETAILED DESCRIPTION OF PREFERRED EMBODIMENT

Figure 1A:
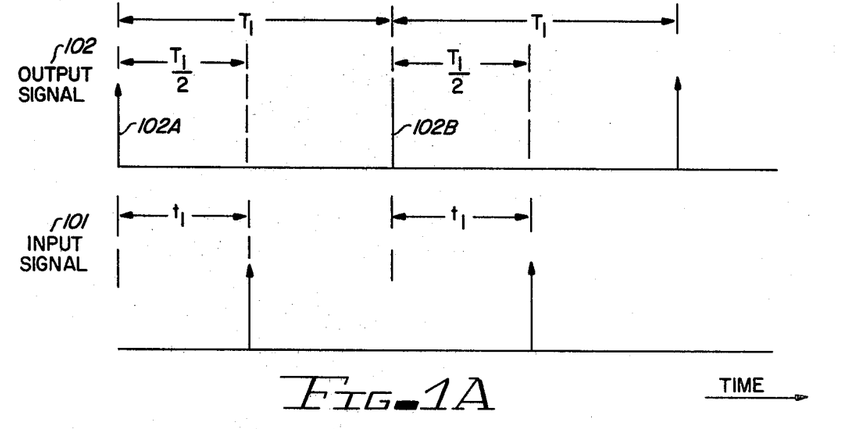
FIG. 1A is a timing diagram illustrating the timing relationships between the Input and Output Signals when there is a zero difference in phase between successive Input Signals.
Figure 1B:
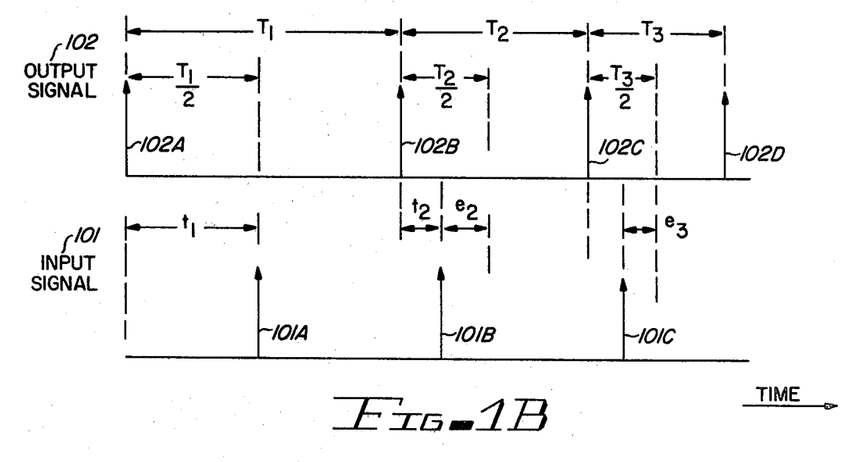
FIG. 1B is a timing diagram illustrating the timing relationships between the Input and Output Signals when the Input Signal experiences a change in phase.

FIGS. 1A and 1B illustrate the time relationships between the Output Signal 102 and Input Signal 101 for the present invention.

It should be understood in connection with FIGS. 1A and 1B that the indicated Input Signal 101 and Output Signal 102 are representative of the occurrence of a predefined event, such as a high-to-low transition, a low-to-high transition, the occurrence of an impulse signal, etc. The precise nature of the event is a matter of definition, and will depend upon the particular application of the present invention. Hereinafter, the occurrence of said event on the Input Signal 101 will be referred to as an Input Event, and the occurrence of an output on Output Signal 102 as an Output Event.

From FIG. 1A, which illustrates the time relationship between the Input Event 101 and the Output Event 102 for the case when the Input Event 101 and Output Event 102 agree in frequency and in phase, it is observed that the Output Event will occur at a point midway between successive Input Events. In the present invention, this time relationship between Input and Output Events is defined to be indicative of a zero phase difference between the Input Signal 101 and the Output Signal 102. Consequently, the existence of a non-zero phase difference between the Input Event 101 and the Output Event 102 will be indicated by the occurrence of an Output Event at a point other than midway between successive Input Events.

FIG. 1B illustrates the effect on the Output Event 102 when the Input Event 101 undergoes a change in phase. It will be observed from FIG. 1B that the Input Event 101A occurs on Input signal 101 at time interval t1 after the occurrence of Output Event 102A on Output Signal 102. For the case when the Input Event 101 and the Output Event 102 agree in both frequency and phase, t1=T1/2. Thereafter, Input Event 101 undergoes a change in phase with the occurrence of the next Input Event 101B on Input Signal 101. Input Event 101B occurs an amount of time t2 after the occurrence of Output Event 102B. Due to the change in phase of Input Event 101 by the occurrence of Input Event 101B earlier than expected, time period t2 will not equal one-half of the expected time between Output Events 102B and 102C had there been no change in the phase of the Input Event on Input Signal 101; in particular there now exists an error e2 equal to one-half the difference in the expected time between the Output Events 102B and 102C, had there been no change in phase on Input Signal 101, and the time t2 between Output Event 102B and Input Event 101B, i.e., e2=(T1/2)−t2. It will be observed that as a result of Input Event 101B occurring earlier than expected, Output Event 102C, from the Digital Phase-Locked Loop, will now necessarily occur earlier following 102B than 102B occurred following 102A, i.e., T2 will be less than T1, as the Phase-Locked Loop is now in the process of adjusting the frequency of the Output Event on Output Signal 102 to its new frequency of operation, in response to the change in the frequency of the Input Event Input Signal 101, so that the phase of the Output Event 102 will agree with the phase of the Input Event 101.

It is further observed during the next sequence of Input Event 101C and Output Event 102D, that Output Event 102D will again occur earlier than Output Event 102C, i.e., T3 will be less than T2, such that error e3 will be less than error e2. This sequence will continue until the amount of error, e, approaches zero, indicating agreement in both frequency and phase between the Input Signal 101 and Output Signal 102.

Figure 2:
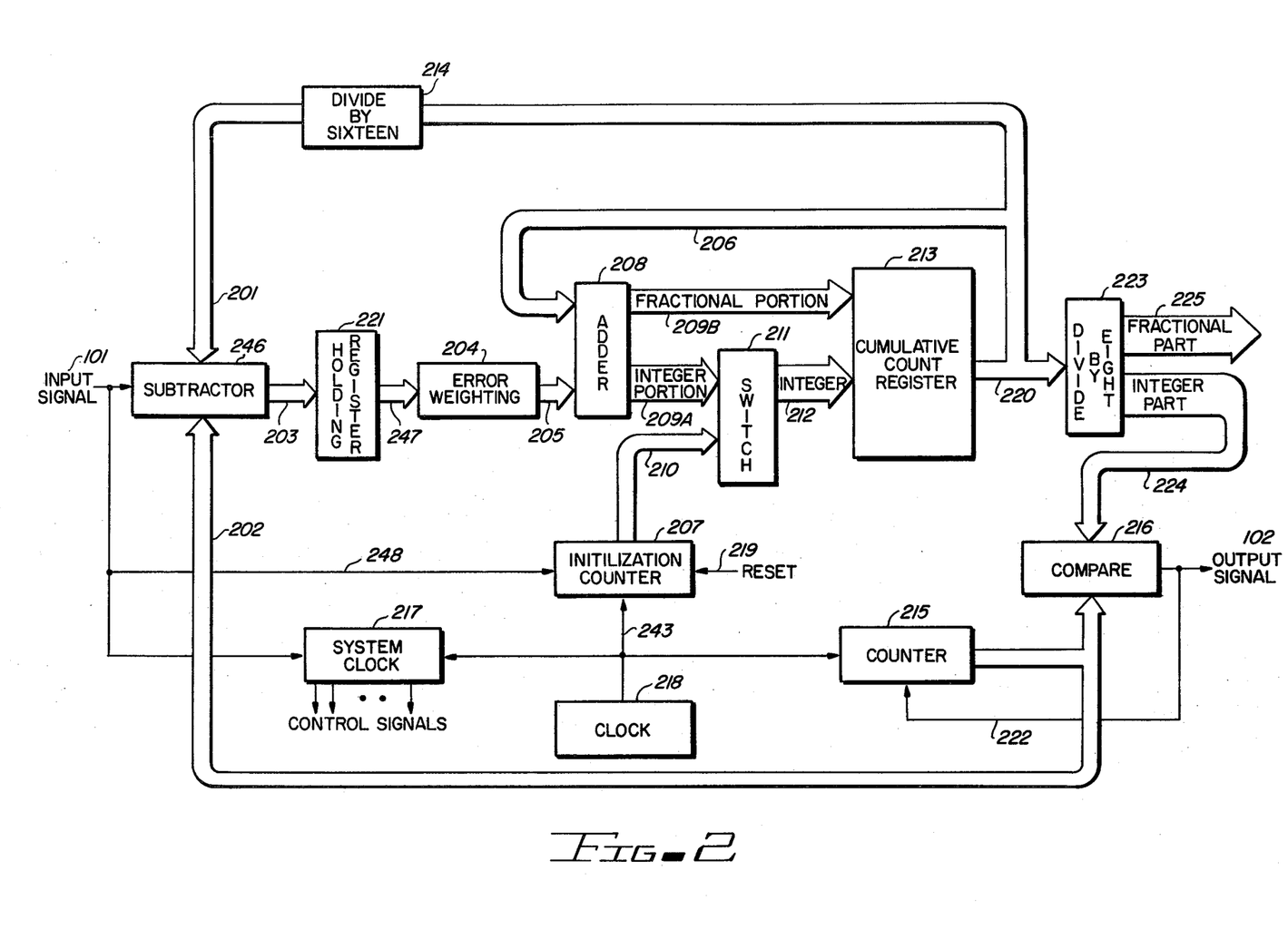
FIG. 2 is a detailed block diagram of the present invention.

FIG. 2 is a functional block diagram of the present invention. It is to be understood that each of the functional blocks represented in FIG. 2 performs a function as hereinafter described, and may or may not require hardware logic elements for their individual implementation, as will subsequently become apparent.

The following discussion will begin by a description of the functions performed by each of the functional blocks appearing in FIG. 2, followed by a discussion of how the functional blocks operate together to perform the function of a digital phase-locked loop. Thereafter the implementation of each block will be given, concluding with a discussion of how the implementation of the digital phase-locked loop operates.

Subtractor 246 is a digital subtractor which, upon the occurrence of an Input Event on Input Signal 101, will perform the digital subtraction of a subtrahend 201, i.e., the contents of Cumulative Count Registier 213 after division of the contents thereof by sixteen by Divide-by-Sixteen 214, from a minuend 202, i.e., the contents of Counter 215, to form a difference 203, hereinafter referred to as an error signal.

Holding Register 221 is a register which temporarily stores the results 203 of Subtractor 246.

Error Weighting 204 applies a numeric weighting factor to the digitally formatted error signal 203,247 producing a numeric result, in a digital format, as 205.

Adder 208 is a digital adder which performs the addition of the error signal 205 after appropriate weighting from Error Weighting 204 with the current contents 206 of Cumulative Count Register 213 to produce a sum composed of an Integer Portion 209A and a Fractional Portion 209B.

Initialization Counter 207 is a counter which is reset by a momentary low signal on Reset 219, and thereafter counts the number of pulses 243 generated by Clock 218 which occur during the time required for eight Input Events to occur on Input Signal 101.

Switch 211 is a digital switch which selects either the contents of Adder 208 by signal 209A or the contents of Initialization Counter 207 by signal 210 to be supplied by signal 212 to Cumulative Count Register 213.

Cumulative Count Register 213 is a register which contains a number which represents the number of pulses generated by Clock 218 which are expected to occur in the time required for eight Input Events to occur on Input Signal 101.

Divide-by-Sixteen 214 provides the functions of dividing the contents of Cumulative Count Register 213 by sixteen.

Divide-by-Eight 223 divides the current contents 220 of Cumulative Count Register 213 by eight, and presents the integer portion of the results 224 to Compare 216.

Counter 215 is a counter which counts the number of pulses generated by Clock 218 in a given time period, and is reset by the occurrence of an Output Event on Output Signal 102 on line 222.

Compare 216 is a digital comparator which compares the numeric contents of Counter 215 with the numeric contents of Cumulative Count Register 213 after division of the contents thereof by eight by Divide-by-Eight 223, and generates Output Signal 102 when the said two numeric values agree.

Clock 218 is a source of pulses regularly spaced in time.

System Clock 217 is a logic network which generates a plurality of pulses in particular sequence which are used for control signals within the present invention.

The above combination of functional elements shown in FIG. 2 operate together to perform the function of a digital phase-locked loop in the following manner.

Initially the digital phase-locked loop must sample the frequency of the Input Signal 101 to determine the average frequency thereof. This is accomplished as follows.

Upon application of Reset Signal 219, to Initialization Counter 207, Initialization Counter 207 begins counting pulses on signal 243 generated by Clock 218 immediately following the first Input Event on signal 248 which occurs on Input Signal 101. Initialization Counter 207 continues to count said pulses generated by Clock 218 until a total of eight Input Events have occurred on Input Signal 101.

During the intitialization period, Switch 211 connects the contents of Initialization Counter 207 to the inputs of Cumulative Count Register 213, and shortly after the occurrence of the ninth Input Event on Input Signal 101, the contents of Initialization Counter 207 are transferred to Cumulative Count Register 213. Immediately thereafter, Switch 211 changes so as to thereafter connect the integer output 209A of Adder 208 to Cumulative Count Register 213 for transfer of the integer output of said Adder 208 to Cumulative Count Register 213 at the appropriate time, as later described herein.

Simultaneously upon the occurrence of the ninth Input Event on Input Signal 101, Counter 215 begins counting pulses generated by Clock 218.

Compare 216 compares the contents of Counter 215 with the number present in Cumulative Count Register 213 after said number has been divided by eight by Divide-by-Eight 223. When the number present in Counter 215 is equal to the number present in Cumulative Count Register 213 after division of the contents thereof by eight by Divide-by-Eight 223, Compare 216 will generate an Output Event on Output Signal 102, which will also reset Counter 215 by signal as applied by 222.

At this point it should be observed that the number present in Cumulative Count Register 213 was originally obtained from Initialization Counter 207 and represents the number of pulses generated by Clock 218 during the time required for eight Input Events to occur on Input Signal 101. Consequently, division of the number present in Cumulative Count Register 213 by eight will yield a number which represents the number of pulses from Clock 218 expected to occur between successive Input Events on Input Signal 101.

It should also be observed that since Counter 215 is reset by signal 222 by the occurrence of an Output Event on Output Signal 102, Counter 215 begins counting pulses generated by Clock 218 immediately following the occurrence of said Output Event on Output Signal 102.

With the functional blocks of the Cumulative Count Register 213, Divide-by-Eight 223, Counter 215 and Compare 216 operating as above described, it will be observed that the Output Event on Output Signal 102 will occur when the number of pulses generated by Clock 218 as counted by Counter 215 equals the expected number of pulses generated by Clock 218 between successive Input Events as represented by the integer number stored in Cumulative Count Resistor 213 after division thereof by eight by Divide-by-Eight 223.

The number which was previously stored in Cumulative Count Register 213, which represents the number of pulses generated by Clock 218 during the interval of time required to eight Input Events to occur on Input Signal 101 is divided by sixteen by Divide-by-Sixteen 214 and supplied as the subtrahend input 201 to Subtractor 246. The minuend input 202 to Subtractor 246 is supplied from Counter 215.

Subtractor 246 subtracts a subtrahend 201, which is the current contents of Cumulative Count Register 213 after said contents have been divided by sixteen by Divide-by-Sixteen 214, from a minuend 202 which is the contents of Counter 215. The results of said subtraction will be transferred to Holding Register 221 at the occurrence of an Input Event on Input Signal 101.

Hence division of the contents of Cumulative Count Register 213 by sixteen will yield a number which represents the expected number of pulses generated by Clock 218 to have occurred when the next Input Event is expected to occur on Input Signal 101, from the occurrence of the last Output Event on Output Signal 102. See FIG. 1A and 1B. However, Counter 215 is counting the number of pulses generated by Clock 218 which have occurred from the occurrence of the last Output Event on Output Signal 102. On the occurrence of the next Input Event on Input Signal 101, the difference between the number contained in the Cumulative Count Register 213, after division by sixteen by Divide-by-Sixteen 214, and the number present in Counter 215 will indicate whether or not the said Input Event on Input Signal 101 occurred when expected. In particular, if said Input Event did not occur when expected, the results of said subtraction will produce a non-zero result 203 which represents the number of pulses generated by Clock 218 by which said Input Event was displaced in time from the point at which it was expected. This number will be referred to herein as an Error Signal 203, and will, upon the occurrence of said Input Event on Input Signal 101 be transferred to Holding Register 221.

The Error Signal 247 from Holding Register 221 is applied to Error Weighting 204.

In dealing with error correction in phase-locked loops, it is generally not desirable to completely correct a phase error in an output signal. Rather, the preferred approach in practice is to correct a phase error in an output signal by only a portion of the measured phase error during each cycle of the output signal, so as to effect a relatively gradual change in the phase of said output signal. By so doing, the phase of the output signal is gradually adjusted to agree with the phase of the input signal.

In the present invention, it will be recalled that the Output Signal 102 is generated by Compare 216 when the number of pulses generated by Clock 218, as counted by Counter 215, equals the expected number of said pulses to occur, as obtained by comparing the contents of Counter 215 with the contents of Cumulative Count Register 213 after said contents thereof have been divided by eight by Divide-by-Eight 223. Consequently, it will be observed that by changing the contents of Cumulative Count Register 213, the point in time at which Compare 216 will generate an Output Event on Output Signal 102 can be altered. It is in this manner that the phase of Output Signal 102 is adjusted to agree with the phase of the Input Signal 101. This relationship can be expressed as $$Cn = Co + EK \quad (1)$$

where
- Cn = expected number of pulses generated by Clock 218 to occur between successive Input Events on Input Signal 101, after correction for any measured change in phase on Input Signal 101.
- Co = expected number of pulses generated by Clock 218 to occur between successive Input Events on Input Signal 101.
- E = the number of pulses generated by Clock 218 by which the Input Event on Input Signal 101 was displaced in time from the point at which said Input Event was expected.
- K = the amount of correction, expressed as a percent, by which it is desired to adjust the phase of the Output Signal 102 in response to a change in phase on Input Signal 101.

It is observed from equation (1) that the value chosen for K will control the amount of time required by the present invention to respond to a change in the phase occurring on Input Signal 101. It will be particularly noted that the value assigned to K could be dynamically changed, based, for example, upon the measured error, or other factors dictated by the particular application. Such extensions or modifications of the present invention are contemplated by the present invention.

In the present embodiment, however, a static value for K has been chosen equal to 6.25%, based upon the fact that binary division by 16 is easily implemented, i.e., 1/16 = 0.0225.

Replacing K with 1/16 in equation (1) yields $$Cn = Co + E/16 \quad (2)$$

Multiplying each side of equation (2) by eight yields $$8\,Cn = 8\,(Co + E/16) \quad (3)$$

$$8\,Cn = 8\,Co + E/2 \quad (4)$$

It is observed that 8Co represents the number present in Cumulative Count Register 213. It follows from equation 4 that by dividing the measured error by two, and adding the resulting quotient to the current contents of Cumulative Count Register 213, the resulting sum will equal eight times the expected number of pulses to be generated by Clock 218 which are anticipated to occur between successive Input Events on Input Signal 101, to correct the phase of the Output Signal 102 by 6.25% of the measured error signal 203.

Consequently Error Weighting Factor 204 in the present embodiment provides for division by two of error signal 203.

Adder 208, as indicated by equation (4), performs the addition of the measured error 203 after division by two, with the contents of Cumulative Count Register 213.

Thereafter, the number present in Cumulative Count Register 213 represents the number of pulses generated by Clock 218 expected to occur between successive Input Events on Input Signal 101, to affect a phase adjustment of 6.25% of a measured error in phase occurring on the Input Signal 101, multiplied by eight.

While the above description of the operation of the present invention has been in general terms, practical considerations raised by implementing the present invention will hardware must be taken into consideration in the reduction to practice.

Due to the fact that Error Weighting 204 requires division of Error Signal 203 by two, clearly a numeric result is possible which may be composed of a whole number and a fractional part. Therefore, the number present in Cumulative Count Register 213 may be composed of a whole number plus a fractional part. Consequently, when the contents of Cumulative Count Register 213 are divided by eight by Divide-by-Eight 223 and presented to Compare 216 by signal 224, any fractional part is not considered by Compare 216 in comparing the contents of Cumulative Count Register 213 after division by eight by Divide-by-Eight 223, with the contents of Counter 215. Likewise, during initialization, as only whole number pulses generated by Clock 218 are counted by Initialization Counter 207, necessarily only a whole number result is transferred by Switch 211 to Cumulative Count Register 213. Consequently Switch 211 switches only the whole number inputs to Cumulative Count Register 213 between Initialization Counter 207 and Adder 208. The fractional results from Adder 208 are therefore connected directly to the appropriate fractional portion of Cumulative Count Register 213 as discussed more fully hereafter.

The implementation of the functional blocks of FIG. 2 will now be discussed.

The preferred embodiment of the present invention was implemented using the following standard parts available from Texas Instruments Incorporated, P.O. Box 5012, Dallas, Tex. 75222.

| Part Type | Description |
| --- | --- |
| 74S00 | Quad 2-Input NAND |
| 74S04 | Hex Inverter |
| 74S08 | Quad 2-Input AND |
| 74S74 | Dual-D Flip Flop |
| 74S85 | 4-Bit Magnitude Comparator |
| 74S86 | Quadruple 2-Input Exclusive-OR Gate |
| 74S157 | 4-Bit 2-to-1 Select |
| 74S161 | 4-Bit Binary Counter |
| 74S175 | 4-Bit D-Register |
| 74S283 | 4-Bit Adder |

The reference data sheets on each of the above listed parts, as same appears in *The TTL Data Book*, Second Edition-1976, Texas Instruments Incorporated, is incorporated herein by reference.

Clock 218 can be implemented in numerous ways well known in the art. In the preferred embodiment of the present invention, the frequency at which Clock 218 was chosen to operate was approximately twenty times the expected frequency of Input Signal 101, however other values could be chosen.

Figure 5A:
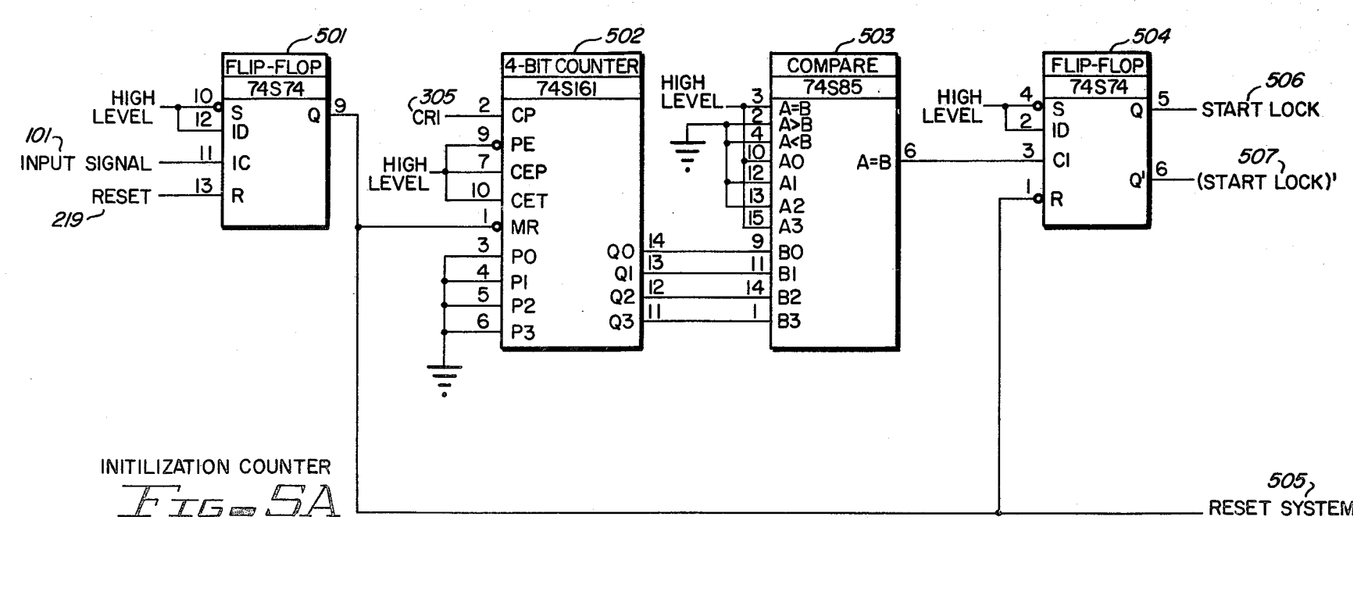
FIGS. 5A and 5B illustrate the implementation of the Initialization Counter 207 shown in FIG. 2.
Figure 5B:
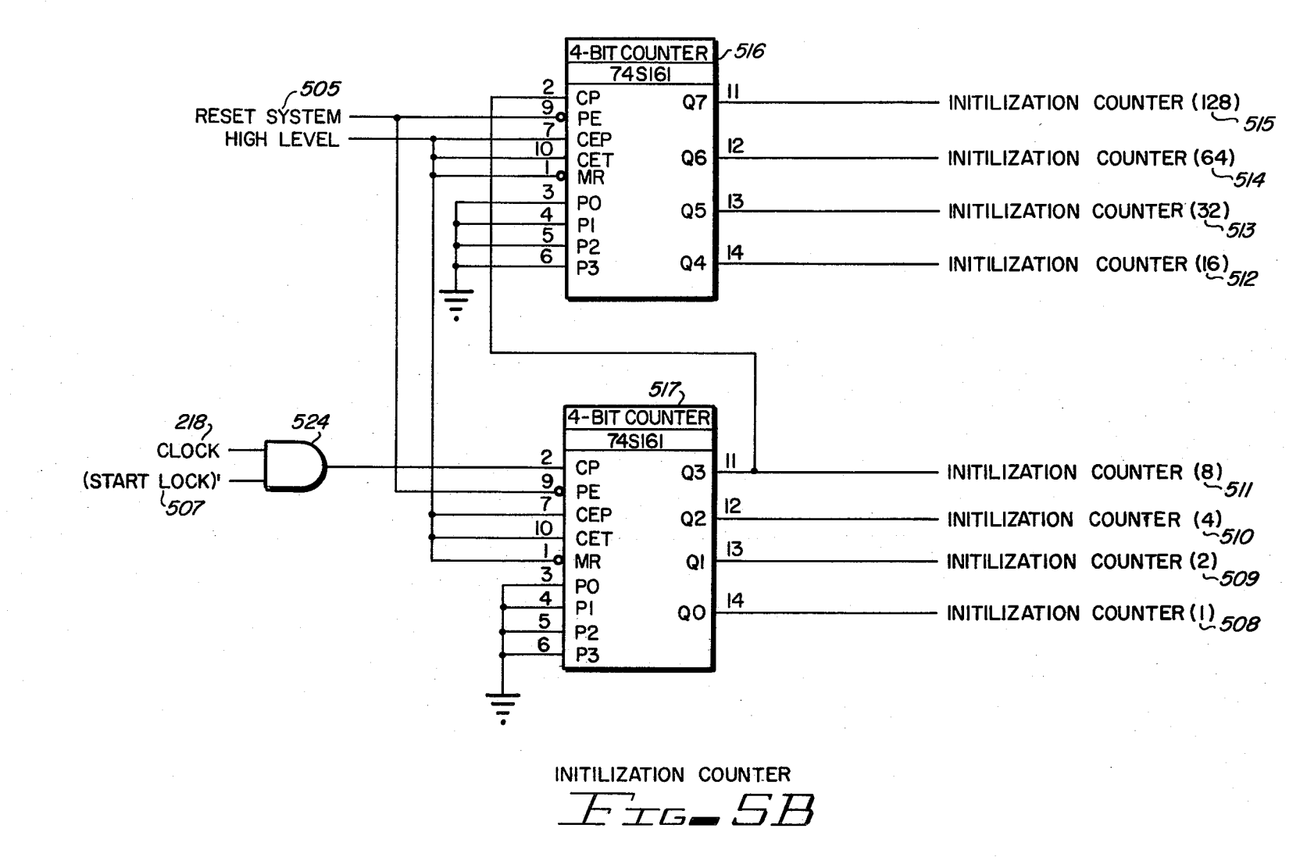

FIGS. 5A and 5B show the implementation of Initialization Counter 207. From FIG. 5A it will be observed that when Reset 219 goes low, Flip-Flop 501 is placed in the reset state, which results in its "Q" output, Reset-System 505, going low, which in turn clears 4-Bit Counter 502 and Flip-Flop 504 shown in FIG. 5A, Quad-D Flip-Flop 301 shown in FIG. 3, 4-Bit Counters 505 and 506 shown in FIG. 5B, Flip-Flop 902 shown in FIG. 9 and 4-Bit Registers 1110 and 1114 shown in FIG. 11.

Figure 3:
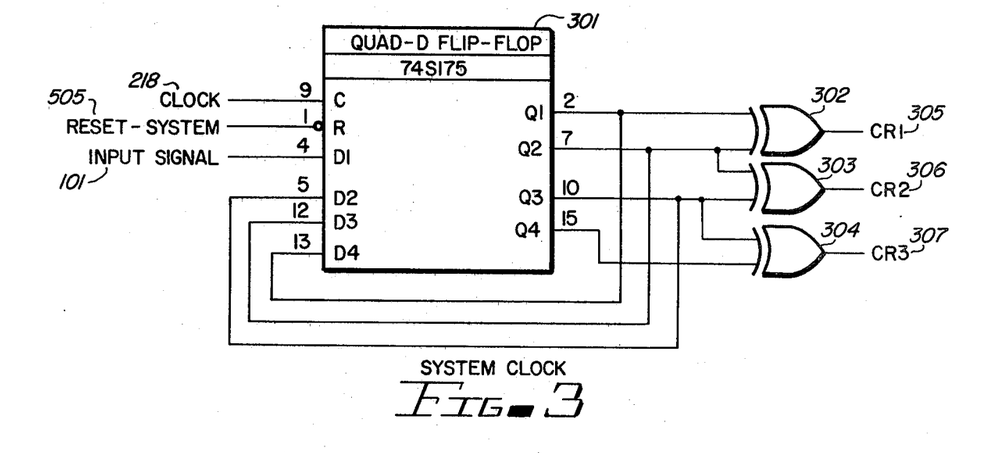
FIG. 3 illustrates the implementation of System Clock 217, shown in FIG. 2.
Figure 4:
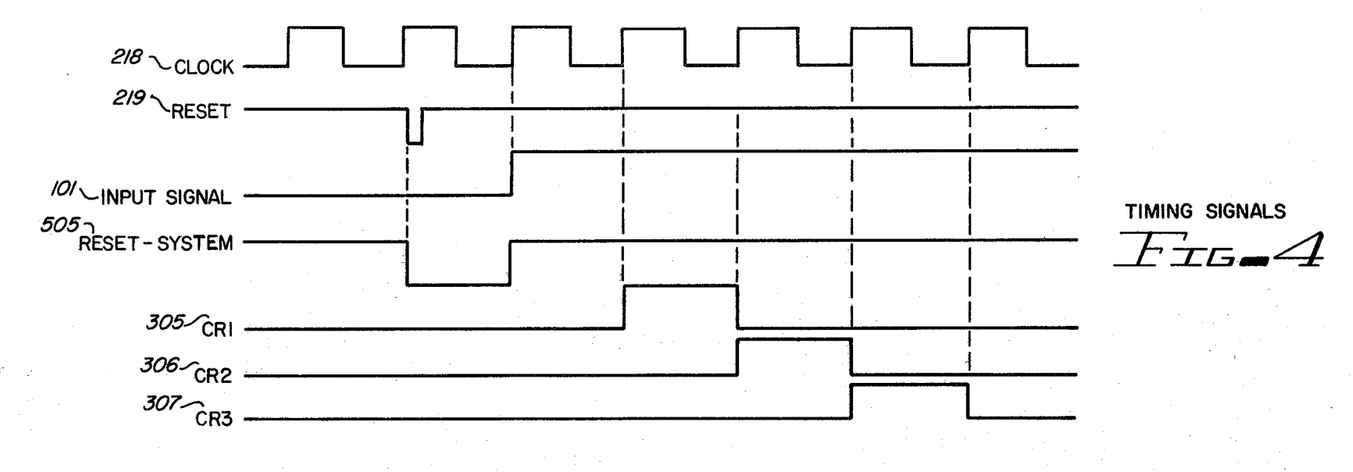
FIG. 4 illustrates the timing relationships of various signals in the present invention.

Referring next to FIG. 3, the implementation of System Clock 217 is shown. It is observed that Quad-D Flip-Flop 301 and Exclusive-OR Gates 302, 303 and 304 are connected in such a manner as to generate sequential control signals CR1 305, CR2 306, and CR3 307 in response to Reset System 505, Input Signal 101 and Clock 218 as shown in FIG. 4, as follows. With Flip-Flop 301 initially reset by Reset-System 505, outputs Q1, Q2, Q3 and Q4 are all at logic zero. When Input Signal 101 changes to a high state, sequential control signals CR1 305, CR2 306, and CR3 307 will be subsequently generated upon the occurrence of sequential pulses on Clock 218. Control signals CR1 305, CR2 306, and CR3 307 are used for sequencing purposes within the present invention.

Returning now to FIGS. 5A and 5B, the operation of Initialization Counter 207 will now be discussed. Four-Bit Counter 502, Compare 503 and Flip-Flop 504 shown in FIG. 5A function together to count the occurrence of eight Input Events on Input Signal 101, during which time 4-Bit Counters 505 and 506 shown in FIG. 5B count the number of pulses generated by Clock 218 to determine the number of pulses generated by Clock 21i during the time required for eight Input Events to occur on Input Signal 101, as follows.

With Flip-Flop 504, shown in FIG. 5A, previously reset by Reset-System 505, (Start-Lock)' will be high, which, by gate 524 in FIG. 5B, will allow 4-Bit Counters 505 and 506 to count the number of pulses generated by Clock 218.

Referring next to FIG. 5A, 4-Bit Counter 502 counts the occurrences of CR1 305, and Compare 503 compares the count obtained by 4-Bit Counter 502 with the number nine as wired into pins A0, A1, A2 and A3 on said Compare 503. After the occurrence of eight Input Events on Input Signal 101, as indicated by the occurrence of a CR1 305 pulse for each of the Input Events on Input Signal 101, on the following Input Event, Compare 503 output A=B will change to a logic one which will result in Flip-Flop 504 "Q" output going high. Hence Start-Lock will change to a high state. This indicates completion of the initialization period during which time the present invention was sampling the frequency of the Input Signal 101 by counting the number of pulses generated by Clock 218 by 4-Bit Counters 505 and 506 shown in FIG. 5B during the time period required for eight Input Events as counted by 4-Bit Counter 502 shown in FIG. 5A to occur on Input Signal 101.

Next, the number of pulses generated by Clock 218 counted by 4-Bit Counters 505 and 506 shown in FIG. 5B, of Initialization Counter 207 will be transferred to the Cumulative Count Register 213 by way of Switch 211, as shown in FIG. 2, as follows.

Figure 8:
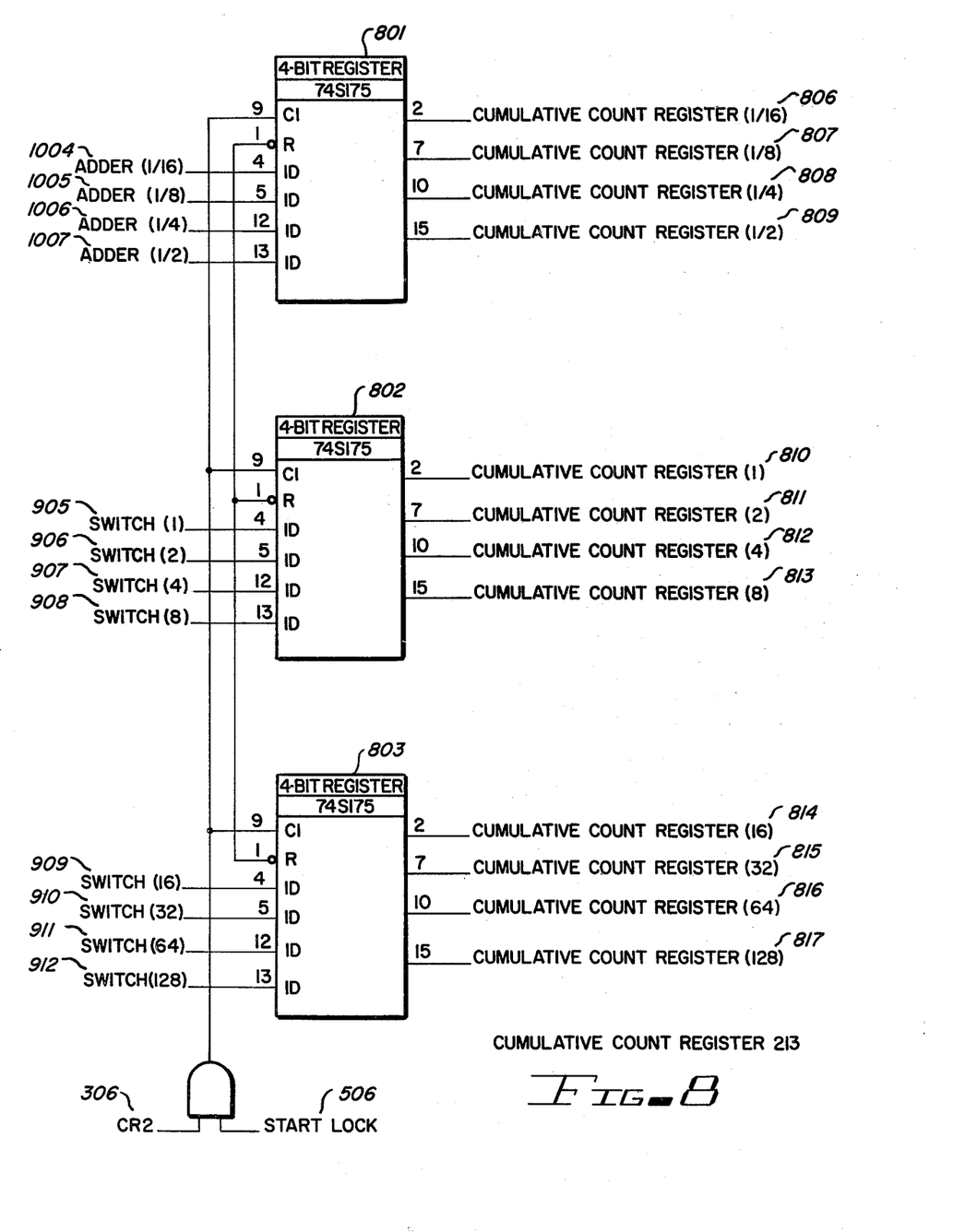
FIG. 8 illustrates the implementation of Cumulative Count Register 213 shown in FIG. 2.
Figure 9:
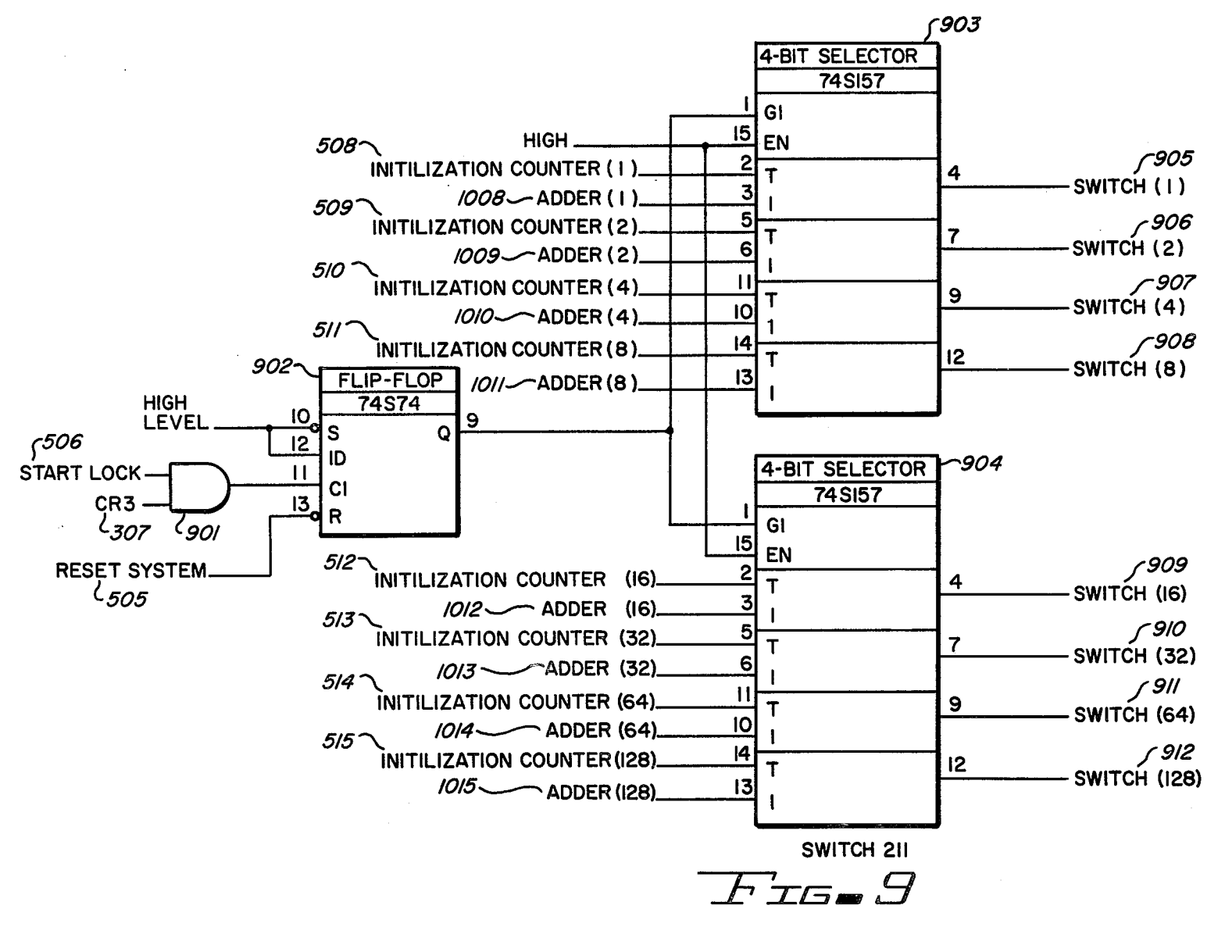
FIG. 9 illustrates the implementation of Switch 211 shown in FIG. 2.

Referring to FIG. 9, with Flip-Flop 902 previously reset by Reset-System 505, the "Q" output of said flip-flop is low, which places 4-Bit Selectors 903 and 904 in a state wherein the outputs of Initialization Counter (1) 508 through Initialization Counter (128) 515 shown in FIG. 5B are connected through said Switch 211 as implemented by 4-Bit Selectors 903 and 904 on FIG. 9 to the corresponding outputs of said Selectors 903 and 904 to Switch (1) 905 through Switch (911) 912 which, referring to FIG. 8, thereby effectively connecting said outputs of Initialization Counter (1) 508 through Initialization Counter (128) 215 to the corresponding inputs of 4-Bit Registers 802 and 803 of Cumulative Count Register 213. Consequently, referring to FIG. 8 gate 805, since Start-Lock is high, on the occurrence of CR2 generated by the ninth Input Event on Input Signal 101, the contents of 4-Bit Counters 505 and 506 of FIG. 5B of Initialization Counter 207 will be transferred to 4-Bit Registers 802 and 803 of FIG. 8 of Cumulative Count Register 213 of FIG. 2.

At this point, the present invention has started operation from a reset condition, and has completed the portion of the initialization process wherein the frequency of Input Signal 101 has been effectively sampled by the counting of the number of pulses generated by Clock 218 during the time required for eight Input Events to occur on Input Signal 101.

The remaining task to be completed in the initialization process is to preload Counter 215 shown in FIG. 2 with the number ten.

Figure 6:
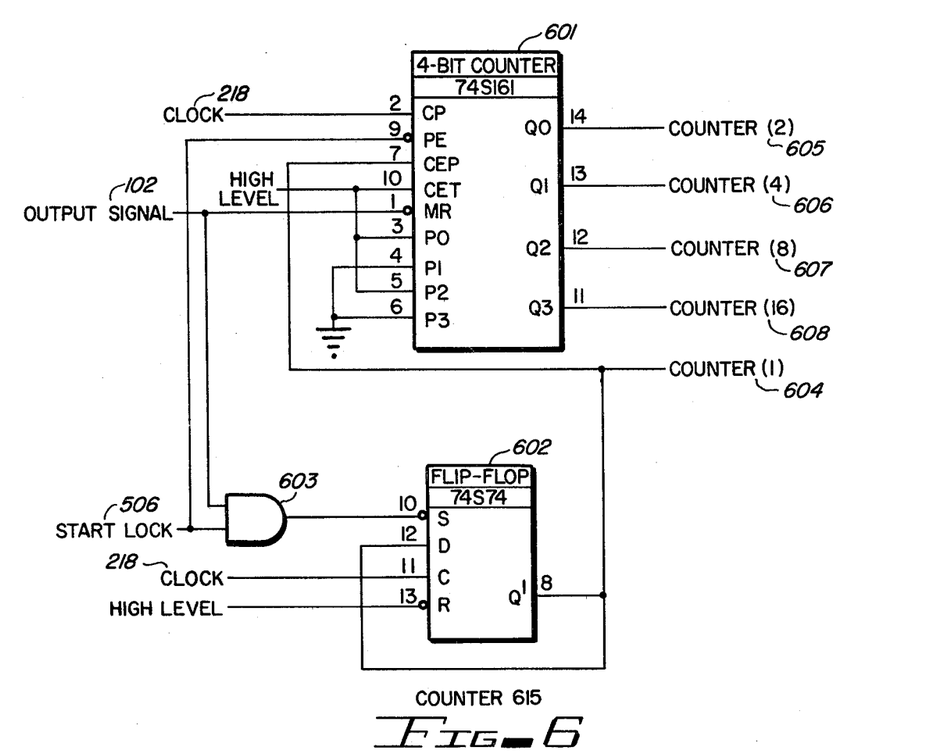
FIG. 6 illustrates the implementation of Counter 215 shown in FIG. 2.

The implementation of Counter 215 is given in FIG. 6. Four-Bit Counter 601 and Flip-Flop 602 together form Five-Bit Counter 215.

It is recalled that during the initialization period discussed above, the Start-Lock signal, shown in FIG. 5A is low, and changes to a high state at the completion of said initialization period. Consequently, referring to FIG. 6, during the initialization period, Flip-Flop 602 will remain in the set state due to the output of gate 603 being low. It will also be observed that the upper 4 bits of Counter 215 as implemented by 4-Bit Counter 601 will be preset by the high level present on preset input pins 3 and 5 and the low level present on pins 4 and 6 such that Counter 215 will be preset to a value of ten during the initialization period. Such presetting is required because, referring to FIG. 1A, it is recalled that the Output Signal 102 occurs at a point midway between successive Input Events on Input Signal 101, and as Counter 215 is, during operation normally reset on the occurrence of Output Signal 102, it will normally begin counting pulses generated by Clock 218 immediately after the occurrence of an Output Event on Output Signal 102. However, when the present invention is initially commencing operation after the initialization process has ended, Counter 215 will necessarily be counting pulses generated by Clock 218 after the occurrence of an Input Event on Input Signal 101. Consequently, it is necessary to preset Counter 215 with a number to reflect the difference in starting times for Counter 215. With the frequency for Clock 218 chosen to be twenty times the expected frequency of Input Signal 101, Counter 215 must therefore be preset with the number ten.

Consequently, directly following the initialization of the present invention by the counting of pulses generated by Clock 218 by Initialization Counter 207, and the transfer of said count to Cumulative Count Register 213, Start-Lock will go to a high state, enabling Counter 215, as implemented by 4-Bit Counter 601 and Flip-Flop 602 on FIG. 6 to begin counting pulses generated by Clock 218, from an initial value of ten.

Figure 11:
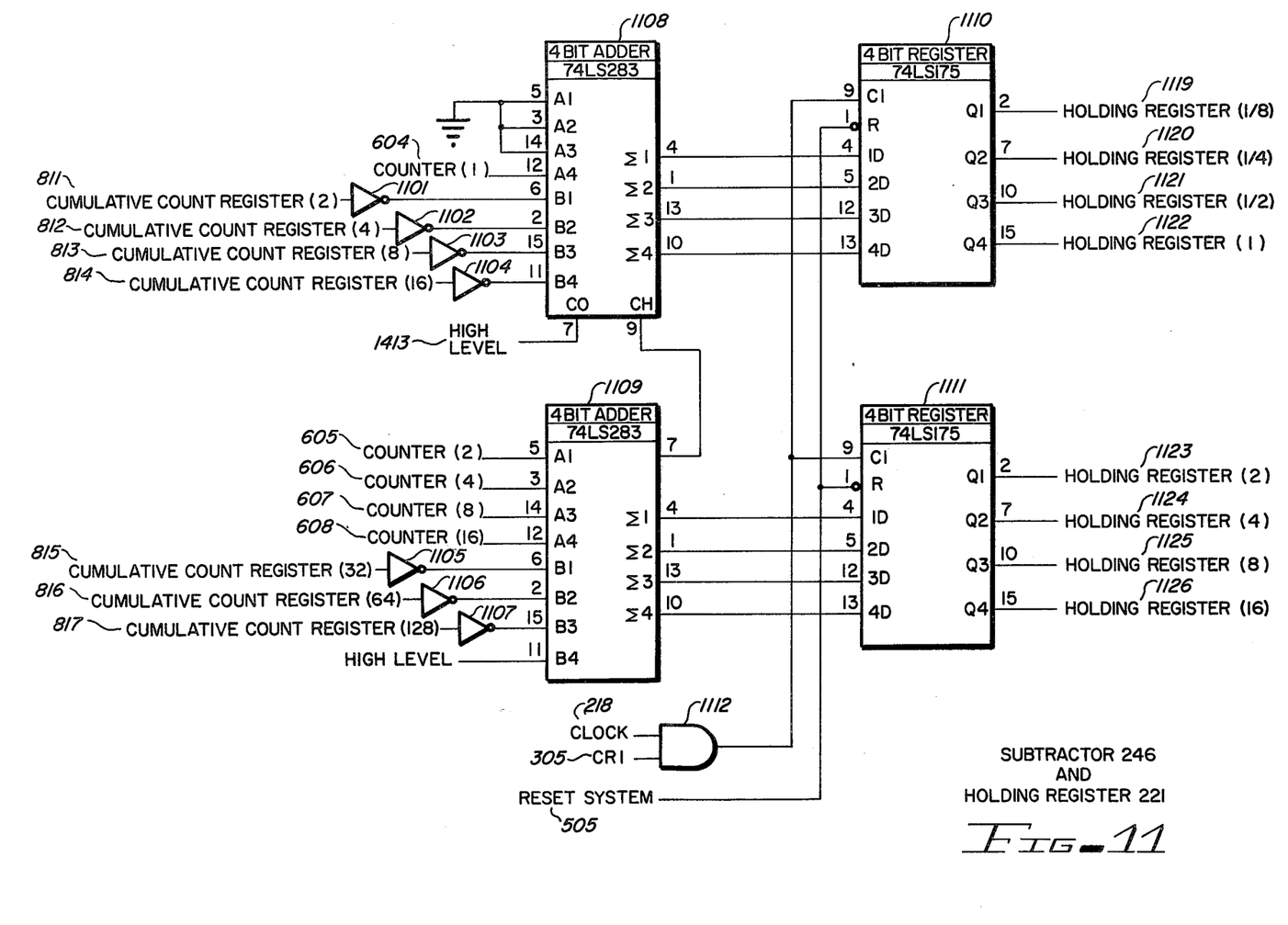
FIG. 11 illustrates the implementation of Subtractor 246 and Holding Register 221 shown in FIG. 2.

FIG. 11 illustrates the implementation of Divide-by-Sixteen 214, Subtractor 246 and Holding Register 221 shown in FIG. 2.

Subtractor 246 is implemented by 4-Bit Adders 1108 and 1190, and Inverters 1101 through 1107. The subtraction is implemented by first forming the 2's complement of the subtrahend, i.e., the number present in Cumulative Count Register 213 on FIG. 2 after Divide-by-Sixteen 214, by Inverters 1101 through 1107 and the addition of a one 1113 to the carry input of 4-Bit Adder 1108, and thereafter adding the minuend, the number present in Counter 215 as signal 202 on FIG. 2, i.e., Counter (1) 604 through Counter (16) 608 shown in FIG. 6.

Divide-by-Sixteen 214 is implemented by the manner in which the signals representing the minuend and subtrahend are connected to 4-Bit Adders 1108 and 1109. It is observed that the most significant bit of the 2's complement of the number present in Cumulative Count Register 213 is added to the most significant bit of the number present in Counter 215, i.e., Counter (16) 608, which results in the equivalence of dividing the number present in Cumulative Count Register 213 by sixteen prior to subtraction.

Holding Register 221 shown in FIG. 2 is implemented by 4-Bit Registers 1110 and 1111 shown in FIG. 11, to which the results of Subtractor 246 is transferred upon the occurrence of a Clock and CR1 signal gate 1112.

As previously described, Error Weighting 204 shown in FIG. 2 functions to divide the number present in Holding Register 221 by two. As the results of this division by two 205 is added to the current contents of Cumulative Count Register 213 by Adder 208, said division by two can be implemented by the method by which the signals representing the contents of Holding Register 221 are connected to Adder 208.

Figure 10:
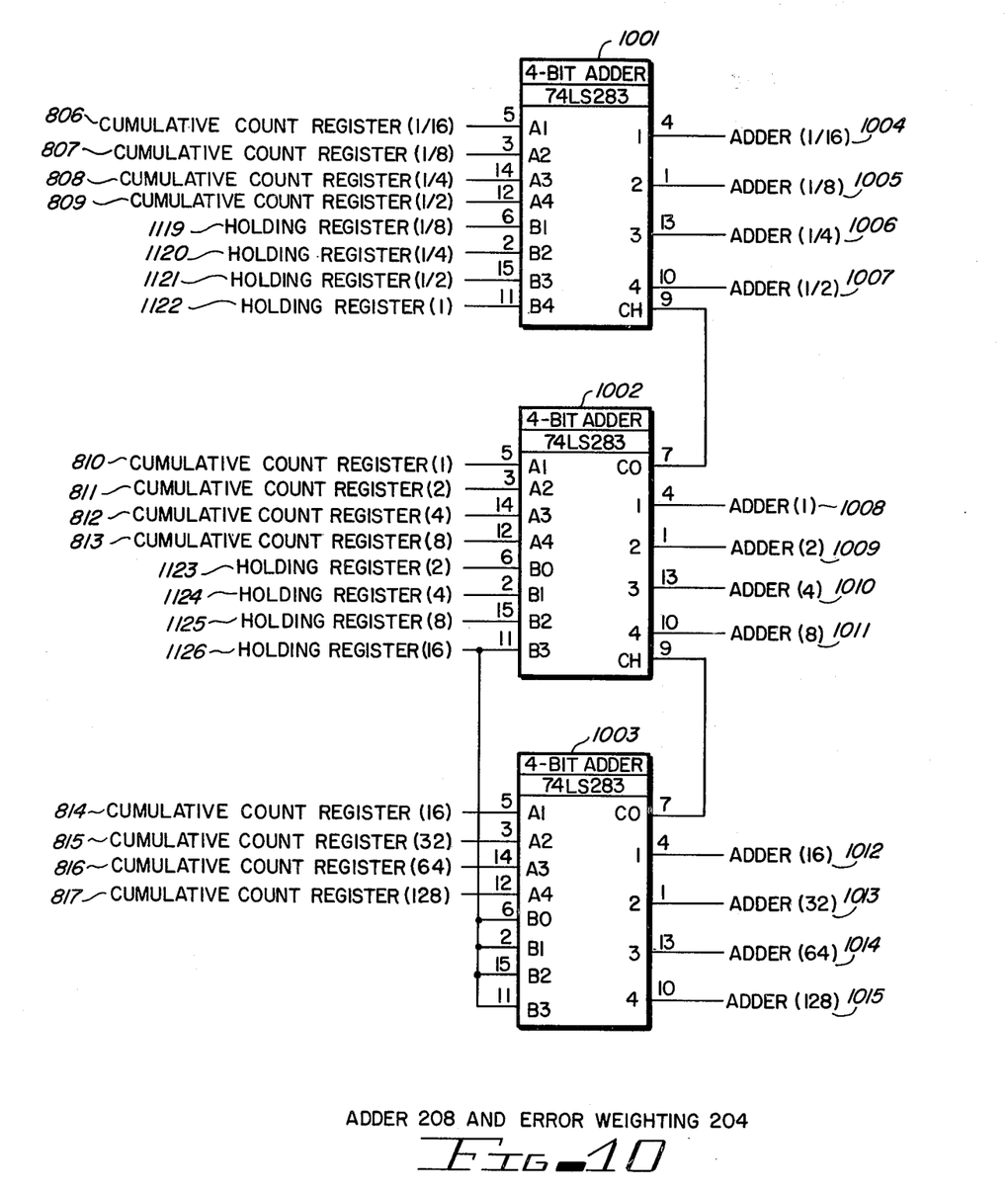
FIG. 10 illustrates the implementation of Adder 208 and Error Weighting 204 shown in FIG. 2.

Consequently the implementation of Error Weighting 204 and Adder 208 is shown in FIG. 10. Four-Bit Adders 1001, 1002, and 1003 implement Adder 208 shown in FIG. 2. It is observed that the signal representing the number present in Holding Register 221 have been shifted one binary position so as to implement division-by-two as above discussed, with Holding Register (1/8) 1119 through Holding Register (16) 1126 being connected in such a manner that the signals thereon appear in the outputs of 4-Bit Adder 1001 and 1002, Adder (1/16) 1004 through Adder (8) 1011 respectively. The most significant bit of the results of the subtraction by Subtractor 246 shown in FIG. 2 with implementation thereof shown in FIG. 11, is connected to the upper four bits of the implementation of Adder 208 shown in FIG. 2 with implementation shown in FIG. 10, so as to correctly reflect the sign as well as the status of the remaining upper bits on Error Signal 205 shown in FIG. 2 in the addition performed by 4-Bits Adders 1001 through 1003 shown in FIG. 10, by Holding Register (16) 1126 signal being also connected to 4-Bit Adder 1003 pins 6, 2, 15 and 11.

The contents of Adder 208 shown in FIG. 2 are then connected to Cumulative Count Register 213 by Switch 211. This is illustrated in FIGS. 13, 12 and 11. It is observed that the lower order four bits from Adder 208, i.e., Adder (1/16) 1004 through Adder (½) 1007, do not go through Switch 211, but connect directly to the lower order 4 bits of Cumulative Count Register 213, i.e., Adder (1/16) 1004 through Adder (½) 1007 to 4-Bit Register 801 shown in FIG. 8. This results from the fact that the said four lower bits from Adder 208 represent a fractional number, and as Initialization Counter 207 counts in whole numbers only, it is not necessary to be able to switch the lower four order bits from Initialization Counter 207 to Cumulative Count Register 213. The remaining bits of Adder 208, shown in FIG. 2, and as implemented by Adder (1) 1008 through Adder (128) 1015 shown in FIG. 10 connect through Switch 211 shown in FIG. 2 as implemented in 4-Bit Selectors 903 and 904 shown in FIG. 9, and then to Cumulative Count Register 213 as implemented by 4-Bit Register 802 and 803 shown in FIG. 8.

Figure 7:
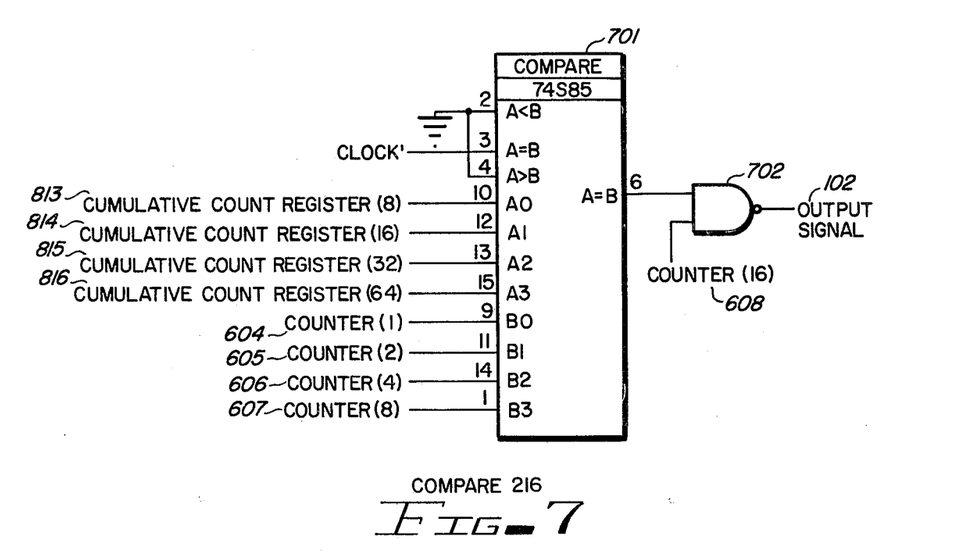
FIG. 7 illustrates the implementation of Compare 216 shown in FIG. 2.

The implementation of Divide-by-Eight 223 and Compare 216 shown in FIG. 2 is illustrated in FIG. 7. Compare 701 and NAND gate 702 together perform the said functions in the following manner.

The division function of Divide-by-Eight 223 is once again implemented by the manner in which the signals from Cumulative Count Register 213, i.e., Cumulative Count Register (64) through Cumulative Count Register (8) and the signals from Counter 215, i.e., Counter (1) 604 through Counter (16) 608 are connected to Compare 701 shown in FIG. 7. Referring to FIG. 7, it is observed the Cumulative Count Register (128) 817 is assumed to be a one, as it necessarily must be when Output Signal 102 is to be produced and consequently, NAND gate 702 ANDS Counter (16) 608 with the signal from Compare 701 indicating agreement between the numbers represented by the signal present on Counter (1) 604 through Counter (8) 607 and the number represented by the signals present on Cumulative Count Register (8) 813 through Cumulative Count Register (64) 816.

Upon the occurrence of Output Signal 102, Counter 215 shown in FIG. 2 as implemented by 4-Bit Counter 601 and Flip-Flop 602 shown in FIG. 6 is reset. At this point, the process is repeated, with Counter 215 shown in FIG. 2 immediately beginning to again start counting the occurrence of pulses generated by Clock 218.

The above description is included to illustrate the operation of the preferred embodiment and is not meant to limit the scope of the invention. The scope of the invention is limited only by the following claims. From the above discussion, many variations will be apparent to one skilled in the art that would yet be encompassed by the spirit and scope of the invention.

We claim:

1. Apparatus, responsive to a first signal, having a period which may vary in time, for producing a second signal displaced in phase from the first signal by a constant amount, comprising:
   a. means for measuring an average period of a predetermined number of periods of the first signal to determine a measured average period of the predetermined number of periods;
   b. means, operatively connected to said means for measuring an average period, for measuring a current period of the first signal to determine a current measured period;
   c. first means, operatively connected to said means for measuring an average period and operatively connected to said means for measuring a current period, for comparing a portion of the measured average period with the current measured period to determine a difference, said portion of the measured current period occurring during the phase corresponding to the amount said second signal is displaced from said first signal;
   d. means, operatively connected to said first means for comparing, for combining the difference with the measured average period so that a change in the period of the first signal is reflected in the measured average period; and,
   e. second means, operatively connected to said means for measuring an average period and operatively connected to said means for measuring a current period, for comparing said current measured period to said measured average period to produce said second signal when said current measured period equals said measured average period, said second signal operatively coupled to said means for measuring the current period to reset said means for measuring the current period.

2. Apparatus, responsive to a series of periodic pulses and to a first signal, for producing a second signal displaced from the first signal by a constant difference in phase, comprising:
  a. averaging means for determining the average number of periodic pulses which occur between successive first signals calculated over a predetermined number of most recent first signals;
  b. counting means, operatively connected to said averaging means, for counting the number of periodic pulses which occur between successive second signals;
  c. difference means, operatively connected to said averaging means and operatively connected to said counting means, responsive to the first signal, for determining a difference between a portion of the average number of the periodic pulses which occur between successive first signals and the number of periodic pulses counted by said counting means;
  d. combining means, operatively connected to said difference means, for combining the difference with the average number of periodic pulses which occur between successive first signals; and
  e. output means, operatively connected to said averaging means and operatively connected to said counting means, for producing the second signal when the number of periodic pulses counted by said counting means equals the average number of periodic pulses which occur between successive first signals.

3. A method, responsive to a series of periodic pulses and a first signal for producing a second signal displaced from the first signal by a constant difference in phase, comprising the steps of:
  a. averaging the number of periodic pulses which occur between successive first signals calculated over a predetermined number of most recent first signals;
  b. counting the number of periodic pulses which occur between successive second signals;
  c. subtracting, upon the occurrence of the first signal, a portion of the average number of periodic pulses which occur between successive first signals from the number of periodic pulses counted from the occurrence of the last signal, forming a difference;
  d. combining the difference with the average number of periodic pulses which occur between successive first signals; and,
  e. producing the second signal when the number of periodic pulses counted from the last occurrence of the second signal equals the average number of periodic pulses which occur between successive first signals.

4. Apparatus, responsive to sequential pulses and a first signal, for producing a second signal displaced in phase from the first signal by a constant angular amount, said apparatus further responsive to a change in the phase of the first signal, whereby the phase of the second signal is adjusted to maintain the constant angular amount, said apparatus comprising:
  a. a first counting means for counting the number of the sequential pulses which occur between a first predetermined number of successive occurrences of the first signal;
  b. storage means for storing the number of the sequential pulses counted by said first counting means which occur between said first predetermined number of successive occurrences of the first signal;
  c. a second counting means for counting the number of the sequential pulses which occur between successive occurrences of the second signal;
  d. a first division means for dividing a first dividend of the number of the sequential pulses counted by the said first counting means and stored in said storage means by a first divisor of a second numeric constant to produce a first quotient;
  e. subtraction means responsive to the first signal for subtracting a subtrahend of the first quotient from a minuend of the number of the sequential pulses which occur between successive occurrences of the second signal as counted by the said second counting means to produce a difference;
  f. combining means for combining the difference with the number of the sequential pulses which occur between the first predetermined number of successive occurrences of the first signal counted by said first counting means and stored in said storage means;
  g. a second division means for dividing the first dividend by a second divisor of a third numeric constant to produce a second quotient; and
  h. a first comparison means for comparing the second quotient with the number of the sequential pulses which occur between successive occurrences of the second signal counted by said second counting means, and generating the second signal when said comparison means detects equality between the two numbers compared.

5. Apparatus as recited in claim 4 wherein said storage means is a 12-bit register.

6. Apparatus, as recited in claim 4, wherein said second counting means is a 5-bit binary counter.

7. Apparatus, as recited in claim 4 wherein said subtraction means comprises:
  a. means for generating a two's-complement representation of the first quotient; and,
  b. means for adding the two's complement representation of the first quotient and the number of the sequential pulses which occur between successive occurrences of said second signal as counted by said second counting means.

8. Apparatus, as recited in claim 4 wherein said first comparison means comprises a comparator to indicate the equality between two 5-bit binary numbers.

9. Apparatus, as recited in claim 4, where the second numeric constant is sixteen.

10. Apparatus, as recited in claim 4, where the third numeric constant is eight.

11. Apparatus, responsive to a sequence of pulses equally spaced in time and to a first signal, for producing a second signal displaced from the first signal by a constant phase angle, said apparatus further responsive to a change in the phase of the first signal, whereby the phase of the second signal is adjusted to maintain the constant phase angle, said apparatus comprising:
  a. a first counter, for counting the number of the sequence of pulses received during the time interval required for the first signal to undergo a preselected number of cycles of operation;
  b. a register for storing the number counted by said first counter;
  c. a second counter responsive to the sequence of pulses for counting the number of the pulses which occur between successive occurrences of the second signal;

d. a first division means for dividing a first dividend of the number contained in said register by a first divisor to produce a first quotient;

e. a second division means for dividing the first dividend by a second divisor to produce a second quotient;

f. a subtraction means responsive to said first signal for subtracting a subtrahend of the first quotient from a minuend of the number counted by said second counter to produce a difference;

g. a third division means for dividing a second dividend of the difference by a divisor to produce a third quotient;

h. addition means for adding the third quotient to the number contained in said register, and i. comparison means for comparing the second quotient with the number counted by said second counter, to produce the second signal upon the occurrence of equality between the numbers compared.

12. Apparatus, as recited in claim 4, wherein said combining means comprises:
   a. a third division means for dividing a second dividend of the difference by a third divisor of a fourth numeric constant to produce a third quotient; and
   b. addition means for adding the third quotient with the numeric contents of said storage means.

13. Apparatus, as recited in claim 12, wherein the fourth numeric constant is two.

14. Apparatus, as recited in claim 12, wherein said addition means is a 12-bit binary adder.

15. Apparatus, as recited in claim 4, wherein said first counting means comprises:
   a. a third counting means responsive to the occurrence of the first signal, for counting the occurrences of the first signal;
   b. a second comparison means, responsive to the number of occurrences of the first signal as counted by said third counting means, which indicates when the number of occurrences of the first signal equals the first predetermined number; and
   c. a fourth counting means, responsive to the sequential pulses for counting the number of the sequential pulses which occur during the time prior to said second comparison means indicating equality between the number of occurrences of the first signal and the first predetermined number.

16. Apparatus, as recited in claim 4 or 15, wherein said first predetermined number equals a multiple of two.

17. Apparatus, as recited in claim 4 or 15, wherein said first predetermined number equals eight.

18. Apparatus, as recited in claim 15 wherein said third counting means is a four-bit binary counter.

19. Apparatus, as recited in claim 15, wherein said fourth counting means is an eight-bit binary counter.

20. Apparatus for producing an output signal having a phase difference which is constant with respect to an input signal, said input signal having a time period subject to fluctuations, comprising:
   a. timing means for generating clock pulses;
   b. register means for storing a total number of said clock pulses which occur in a predetermined number of time periods of said input signal to generate a first and a second output signal, said first output signal representative of the average number of said clock pulses which occur in a time period over said predetermined number of time periods of said input signal, and said second output signal representative of a predicted number of said clock pulses which are expected to occur between said output signal and said input signal;
   c. counter means, operatively connected to said timing means, for counting said clock pulses, said counter means having an output terminal adapted to transmit said counted clock pulses, said counter means initially set to contain a first predetermined number representative of the number of clock pulses expected to occur between said output signal and said input signal;
   d. compare means, operatively connected to the output terminal of said counter means and further operatively connected to said register means, for comparing said counted clock pulses to said first output signal to generate said output signal, said output signal operatively coupled to said counter means for resetting said counter means; and
   e. subtractor means operatively coupled to the output terminal of said counter means and further operatively coupled to said register means, for generating a difference signal between said counted clock pulses and said second signal in response to said input signal, said difference signal operatively coupled to said register means whereby said total number of said clock pulses stored in said register means is modified, causing said first and second output signals of said register means to be modified reflecting the fluctuations of the time period of said input signal, causing the occurrence of said output signal to vary in order to maintain the phase difference and further causing the time period of said output signal to track the time period of said input signal.

21. Apparatus for producing an output signal according to claim 20 further comprising:
   initialization means for initially loading said register means with the total number of said clocking pulses which occur in said predetermined number of time periods of said input signal.

22. Apparatus for producing an output signal according to claim 21, wherein said register means comprises:
   a. counter register means for storing an updated value of the total number of clock pulses which occurred over a most recent predetermined number of time periods of said input signal;
   b. means for algebraically adding the updated value with the difference signal for generating a new updated value;
   c. first divider means for dividing the updated value stored in said counter register means by the predetermined number of time periods to generate said first output signal; and
   d. second divider means for dividing the updated value stored in said counter register means by a second predetermined number to generate said second output signal.

* * * * *